United States Patent [19]

Palmquist et al.

[11] 4,415,861
[45] Nov. 15, 1983

[54] PROGRAMMABLE PULSE GENERATOR

[75] Inventors: Steven R. Palmquist, Beaverton; Ronald D. Gaiser, Aloha, both of Oreg.

[73] Assignee: Tektronix, Inc., Beaverton, Oreg.

[21] Appl. No.: 271,729

[22] Filed: Jun. 8, 1981

[51] Int. Cl.³ .................... H03K 5/26; H03K 3/017
[52] U.S. Cl. .................................... 328/58; 328/61; 307/265
[58] Field of Search ............... 328/58, 60, 61; 307/265

[56] References Cited

U.S. PATENT DOCUMENTS

| 3,697,879 | 10/1972 | Holliday | 328/61 |
| 3,768,026 | 10/1973 | Pezzutti | 307/265 |
| 3,836,858 | 9/1974 | Kitano | 328/58 |
| 4,257,108 | 3/1981 | Igel | 307/265 |
| 4,330,751 | 5/1982 | Swain | 328/61 |
| 4,352,995 | 10/1982 | Yoshida et al. | 307/265 |

Primary Examiner—John S. Heyman
Attorney, Agent, or Firm—George T. Noe

[57] ABSTRACT

A programmable pulse generator which generates a pulse having programmable leading and trailing edges is disclosed. An oscillator starts to generate a pulse in response to a trigger signal, and the pulse is counted by a counter for generating an address signal. A memory circuit generates a pulse having predetermined time occurrence of leading and trailing edges in accordance with the address signal, and the transition detector detects the trailing edge to stop the oscillation of the oscillator.

6 Claims, 6 Drawing Figures

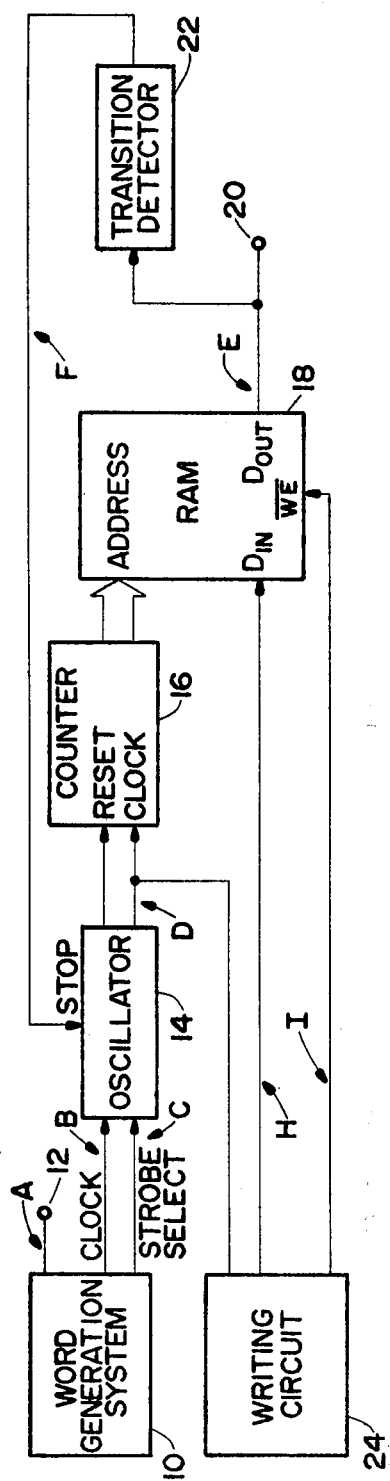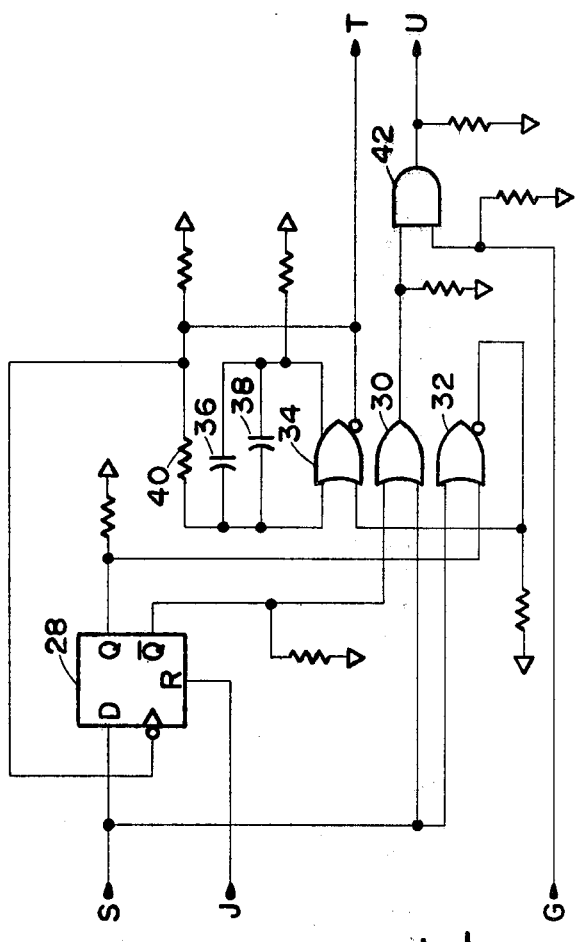

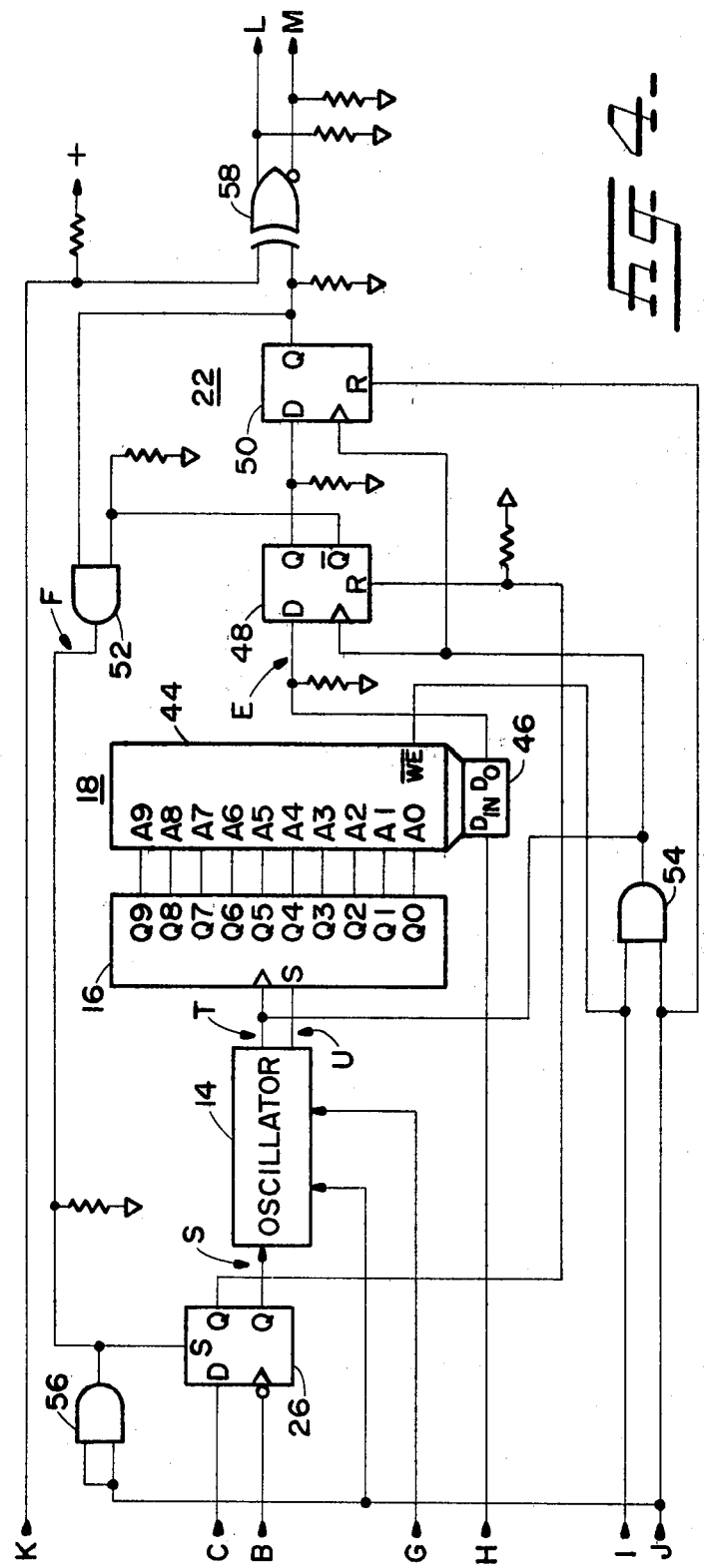

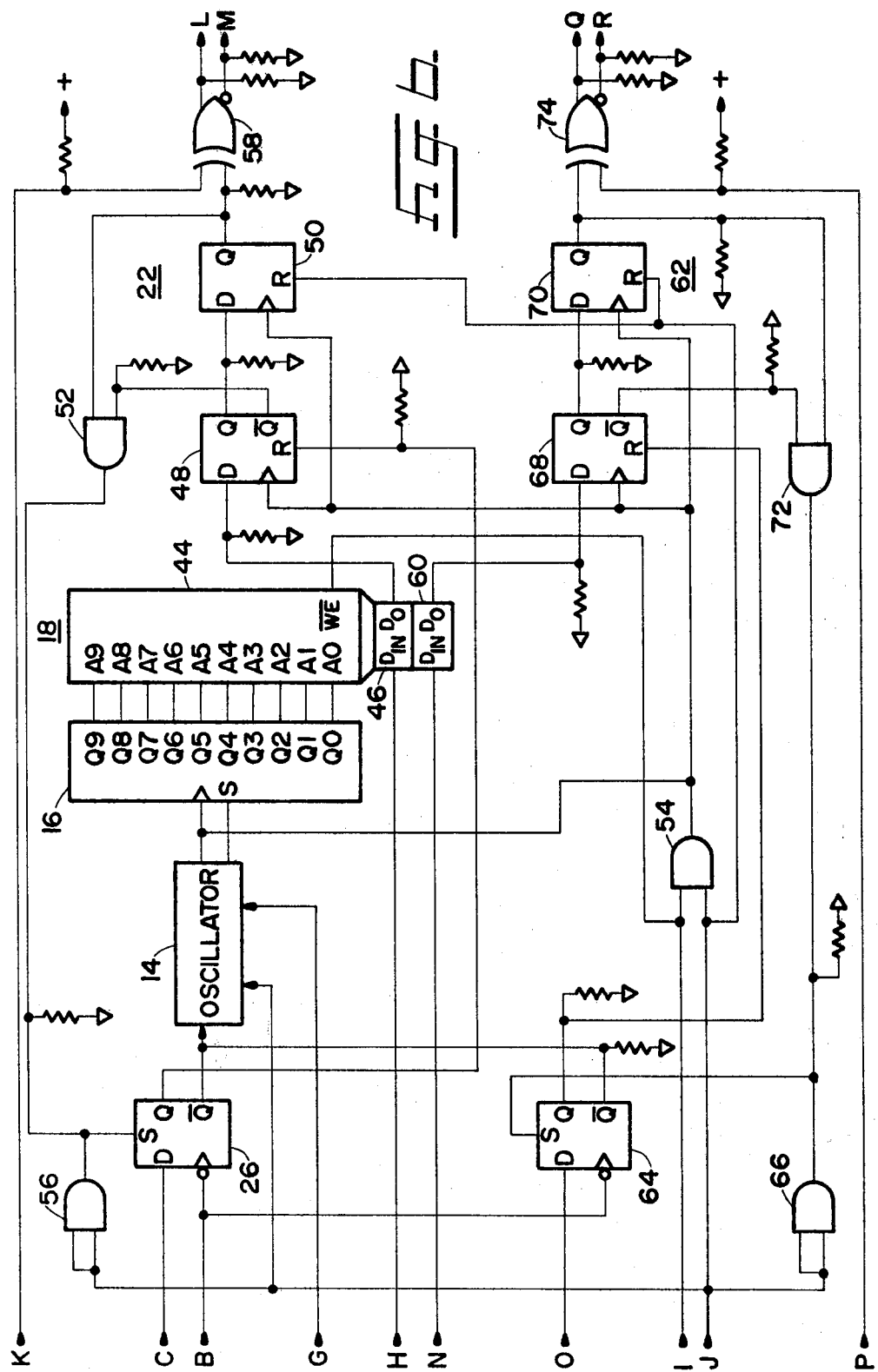

PROGRAMMABLE PULSE GENERATOR

BACKGROUND OF THE INVENTION

The present invention relates to a programmable pulse generator for generating a pulse in response to a trigger signal wherein the timing of the leading and trailing edges of the pulse are programmable.

A one use for a pulse generator is as a strobe pulse generator for a digital word generation system which is used to simulate digital systems such as microcomputer systems. In this instance, the time relationship between the strobe pulse and the digital word pattern from the word generation system must be determined in accordance with the construction of the digital system under test. If the time relationship between the word pattern and the strobe pulse is not proper for the digital system, it cannot acquire the word pattern. So that the word generation system is applicable to many kinds of digital systems, a programmable pulse generator is necessary to generate a strobe pulse, the leading and trailing edges of which are programmable.

Since the word generation system generates the word pattern in accordance with a clock signal, such clock signal may be used as a trigger signal to generate the strobe pulse. However, the clock signal cannot determine the timing of the leading and trailing edges of the strobe pulse, because the clock signal occurs on every cycle of the word pattern and is not synchronized with the leading and trailing edges of the strobe pulse. For determining the time occurrence of the leading and trailing edges of the strobe pulse, a digital delay circuit and/or a monostable multivibrator may be used, and such circuits may be triggered by the clock signal from the word generation system. However, digital delay circuits are complex and expensive, and two such digital delay circuits are necessary to determine both the leading and trailing edges of the strobe pulse. Since the monostable multivibrator uses charge and discharge characteristics of a time constant circuit, the pulse width from the multivibrator varies with the power supply voltage and it is difficult to control the pulse width exactly. Moreover, a plurality of conventional pulse generators are necessary to generate multi-phase strobe pulses.

SUMMARY OF THE INVENTION

According to the present invention, a programmable pulse generator for generating a pulse having programmable leading and trailing edges is provided. When an oscillator receives a trigger signal such as a clock signal from a word generation system, the oscillator starts to generate a pulse having a predetermined frequency. A counter counts this pulse from the oscillator to produce sequentially parallel-bit outputs as an address signal for a memory circuit such as a random access memory (RAM). Since the RAM stores pulse level information, namely, logical "1" and "0," the RAM generates an output pulse in accordance with the address signal from the counter. When the content of the appointed address of the RAM is the logical "0" or "1," the output pulse level is "Low" or "High", respectively. When the contents of the RAM change from "0" to "1," the output levels change from "Low" to "High" and this level changing point corresponds to the leading edge of the output pulse. Similarly, when the contents of the RAM change from "1" to "0", this transition point corresponds to the trailing edge of the output pulse. The above operation is described in terms of positive logic, and "0" and "1" of the RAM are reversed for negative logic.

When a transition detector detects the trailing edge of the output pulse from the RAM, the detector generates a pulse to stop the pulse generation of the oscillator. Thus, a large memory capacity for the RAM is not necessary. The time relationship between the trigger signal and the output pulse (leading and trailing edges) is determined by the oscillation frequency of the oscillator and the contents of the RAM. It should be noted that the counter is reset before it receives the pulse from the oscillator.

For generating multi-phase pulses, an additional RAM produces a second pulse in accordance with the address signal from the common counter. An additional transition detector detects the trailing edge of the second pulse. When both transition detectors detect the trailing edges of the first and second pulses, the common oscillator stops operating.

The counter and RAM may be conventional ICs, and the transition detector may consist of a combination of conventional logic ICs.

It is therefore one object of the present invention to provide a programmable pulse generator which generates a pulse having programmable leading and trailing edges.

It is another object to provide a programmable pulse generator which can control exactly the time occurrence of the leading and trailing edges of a pulse.

It is a further object to provide a programmable pulse generator which is simple and inexpensive in construction.

It is an additional object to provide a programmable pulse generator which properly generates a strobe pulse for a word generation system.

It is another object to provide a programmable pulse generator which includes a memory circuit of small capacity to store a pulse pattern and can easily renew the content of the memory circuit.

Other objects and advantages of the present invention will become apparent to those having ordinary skill in the art when taken in conjunction with the accompanying drawings.

DRAWINGS

FIG. 1 shows a block diagram of a preferred embodiment according to the present invention;

FIG. 4 shows a circuit schematic of a preferred embodiment according to the present invention;

FIG. 5 shows a circuit schematic of an oscillator used in FIG. 4; and

FIG. 6 shows a circuit schematic of an alternative preferred embodiment according to the present invention.

DETAILED DESCRIPTION OF THE INVENTION

Figure 2:
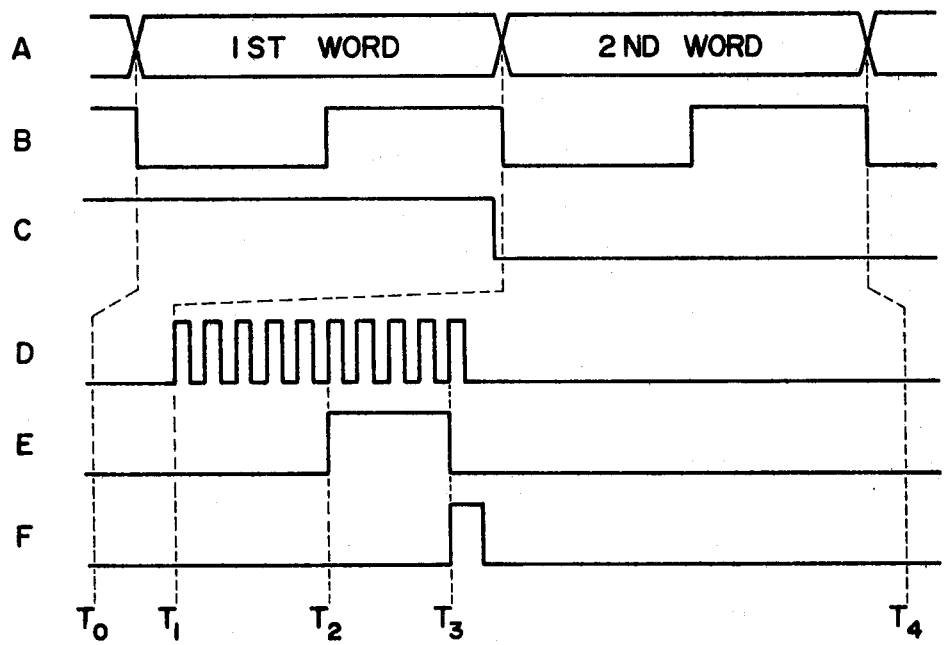
FIG. 2 shows a time chart for explaining the operation of FIG. 1.

Referring to FIG. 1, there is shown a block diagram of a preferred embodiment according to the present invention. This embodiment is used as a strobe generator for a digital word generation system. Word generation system 10 generates a predetermined word pattern A at terminal 12, and applies a clock signal B and a strobe selection signal C to oscillator 14. The clock signal B is generated on each cycle of the word pattern A, and is used as a trigger signal for oscillator 14. The strobe selection signal C acts as an enable signal for oscillator 14, i.e., oscillator 14 is enabled to generate a pulse D only when the strobe selection signal C is "Low". If the signal C is "Low", oscillator 14 starts to generate the pulse D having a predetermined frequency such as 25 MHz (40 n sec) when the clock signal B is applied. The pulse D is applied to the clock terminal of counter 16. Before applying the pulse D to counter 16, oscillator 14 applies a reset pulse to the reset terminal of counter 16 so that all output bits from counter 16 become "0". Memory circuit 18, such as a random access memory (RAM), receives the parallel output bits from counter 16 as an address signal, and applies an output pulse E to output terminal 20 and transition detector 22. When transition detector 22 detects the trailing edge of the output pulse E, detector 22 applies a stop pulse F to oscillator 14 so as to stop the generating operation of oscillator 14. Writing circuit 24 applies a slow rate clock, data H and a write enable signal I to the clock terminal of counter 16 and the data input and write enable terminals of RAM 18, respectively.

Figure 3:
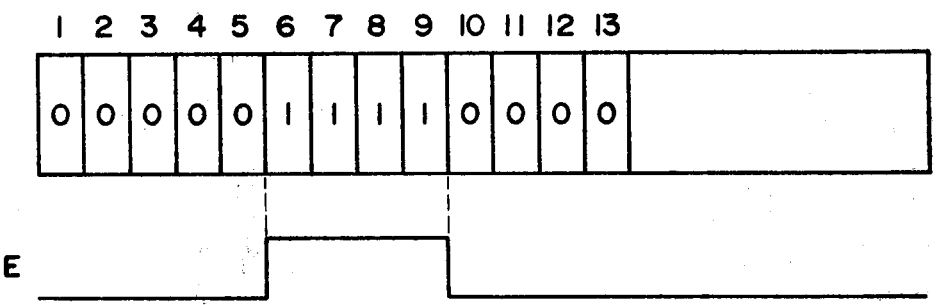
FIG. 3 shows a relationship between the content of a memory circuit and an output pulse of FIG. 1.

The operation of the pulse generator shown in FIG. 1 will be discussed by reference to FIGS. 2 and 3. At a time $T_0$, word generation system 10 generates a first word of the word pattern A in response to the negative-going edge of the clock signal B. Since the strobe selection signal C is "High," oscillator 14 does not generate the pulse. At a time $T_1$, word generation system 10 generates a second word of the word pattern A in response to the clock signal B. Since the strobe selection signal C is "Low," oscillator 14 starts to generate the pulse D when it receives the clock signal B. Counter 16 counts the pulses D and increments the parallel bit output in sequence. For example, the content of RAM 18 is as shown in squares of FIG. 3. The upper side numbers of the squares indicate the memory address. RAM 18 generates the output pulse E in accordance with the address signal from counter 16, because RAM 18 is in the read mode (writing circuit 24 applies "High" to the write enable terminal $\overline{WE}$ of RAM 18). The contents in the address 1 through 5 of RAM 18 are "0", and RAM 18 generates "Low" while counter 16 counts five pulses from oscillator 14. At a time $T_2$, counter 16 counts the sixth pulse and appoints the address 6 of RAM 18. Since the contents of the addresses 6 through 9 of RAM 18 are "1", RAM 18 generates "High" from the time $T_2$ to a Time $T_3$. The content of the address 10 is "0", and RAM 18 generates "Low". It should be noted that the time relationship between the pulses B and E is determined by the contents of RAM 18 and the oscillation frequency of oscillator 14. In this embodiment, the leading and trailing edges of the pulse E occur at the times $T_2$ and $T_3$. When transition detector 22 detects the trailing edge of the pulse E, it generates the stop pulse F to stop oscillator 14. As described hereinbefore, the time occurrence of the leading and trailing edges of the pulse E are exactly controlled by the digital circuits. Since conventional ICs can be used, the present invention is simple and inexpensive in construction. Moreover, a large capacity for RAM 18 is not necessary. Oscillator 14 may apply the reset pulse to counter 16 before oscillator 14 starts to generate the pulse or after oscillator 14 stops operating.

For writing a pulse pattern in RAM 18, writing circuit 24 applies "Low" to the write enable terminal $\overline{WE}$ of RAM 18 so that RAM 18 is in the write mode. Moreover, write circuit 24 applies the slow clock signal to the clock terminal of counter 16, and applies the pulse pattern H to the data input terminal of RAM 18 in synchronism with the slow clock signal. Counter 16 counts the slow clock signal and applies the address signal to RAM 18. It is easy to renew the contents of RAM 18, and any desired pulse pattern can be stored in RAM 18.

FIG. 4 shows a circuit schematic of a preferred embodiment according to the present invention. The clock signal B and the strobe selection signal C are respectively applied to the clock and D inputs of D-type flip-flop 26 such as type 10131 IC. Oscillator 14 receives the $\overline{Q}$ output S from flip-flop 26 as the oscillation control signal, a clear control signal G and a writing control signal J. One example of oscillator 14 is shown in FIG. 5. The $\overline{Q}$ output S from flip-flop 26 and the writing control signal J are applied to the D input and reset terminals of flip-flop 28. Or gate 30 receives the Q output from flip-flop 28 and the oscillation control signal S, and NOR gate 32 receives the Q output from flip-flop 28 and the oscillation control signal S. The inverted output from NOR gate 32 is applied to OR (/NOR) gate 34, and timing capacitors 36 and 38 are connected in parallel between the input and output terminals of OR gate 34. The inverted output of OR gate 34 is applied to the input terminal thereof through timing resistor 40 and further applied to the clock terminals of flip-flop 28 and counter 16. The oscillation frequency is determined by timing capacitors 36–38 and resistor 40. AND gate 42 receives the output from OR gate 30 and the clear control signal G, and applies the output to the count control terminal S of counter 16.

Turning now to FIG. 4 again, the 10-bit output from counter 16 is applied to address decoder section 44 of RAM 18 having memory section 46 which receives the pulse pattern H and applies the output to the D input terminal of flip-flop 48. RAM 18 further receives the write enable signal I. Counter 16 may consist of three type 10136 ICs, and RAM 18 may be type 10146 IC. The Q output from flip-flop 48 is applied to the D input terminal of flip-flop 50, and AND gate 52 receives Q and Q outputs from flip-flops 48 and 50 and applies the stop pulse F to the set terminal of flip-flop 26. Flip-flops 48–50 and AND gate 52 comprise transition detector 22. AND gate 54 receives the write enable signal I and the writing control signal J, and the output thereof is connected to the clock terminals of counter 16 and flip-flops 48–50. The reset terminals of flip-flops 48 and 50 are connected to the Q output of flip-flop 26 and the writing control signal J, respectively. The signal J is applied to the set terminal of flip-flop 26 through AND gate 56 as a buffer. Exclusive OR gate 58 receives the Q output from flip-flop 50 and a polarity control signal K, and generates a push-pull output L and M. The signals G, H, I and J are applied from writing circuit 24 (the signals G and J are not shown in FIG. 1), and the signals B, C and K are applied from word generation system 10 (the signal K is not shown in FIG. 1).

The operation of the circuits of FIGS. 4 and 5 is as follows. In the pulse generation mode, the clear control signal G and the write enable signal I are "High", and the writing control signal J is "Low". When the strobe selection signal C is "Low" and the negative going clock B is applied to the clock terminal of flip-flop 26, "High" is applied to the D input of flip-flop 28 and OR gates 30 and NOR 32. OR gate 30 generates "High" which causes counter 16 to go into the count mode, because the output U of AND gate 42 is "High". It should be noted that the contents of counter 16 is cleared when the output from AND gate 42 is "Low". The output of NOR gate 32 goes "Low", allowing OR gate 34 to start oscillating. As soon as the oscillation starts up, "High" at the D input of flip-flop 28 gets clocked through. As long as flip-flop 28 generates "High," the pulse will continue to oscillate.

Counter 16 counts up in synchronism with the clock signal B, and the output thereof then addresses RAM 18 which generates the pulse E as described hereinbefore. The pulse E is written to flip-flop 48. If the strobe selection signal C is "High," flip-flop 48 is held in the reset mode by the Q output from flip-flop 26, so the pulse E does not pass through. If the strobe selection signal C is "Low," the pulse E is clocked through flip-flop 48 at the interval of the pulse T from oscillator 14. The output from flip-flop 48 is then clocked through flip-flop 50 into exclusive OR gate 58. This gate makes the pulse "Low" active if the polarity control signal K is "High", otherwise leaving the pulse "High" active.

AND gate 52 detects the trailing edge of the pulse E and makes the output F "High" when both the Q output of flip-flop 48 and the Q output of flip-flop 50 are "High". This only occurs when RAM 18's output makes the transition from "High" to "low". The "High" output F from AND gate 52 sets flip-flop 26 to stop the oscillation of oscillator 14.

The oscillation of the pulse T is shut down by either (1) a "High" strobe selection signal C, or (2) by the output F from transition detector 22. Either action causes flip-flop 26 to have the Q output "High" and the $\overline{Q}$ output "Low". This causes the Q output of flip-flop 28 to have "Low" logged in at the next falling edge of the pulse T. The outputs from flip-flop 28 stop the pulse T via NOR gate 32, and load counter 16 with all zeros through OR gate 30. The pulse T now waits to be reactivated by the strobe selection signal C.

RAM 18 is programmed before the pulse generation mode. While programming, the write control signal J is "High", so that the outputs from OR gate 30 and NOR gate 32 are "High" and oscillator 14 does not oscillate. Counter 16 is cleared by the clear control signal G, and advanced in a single step fashion by the write enable signal I through AND gate 54. After each counter advance, the pulse pattern H is loaded into RAM 18. It should be noted that flip-flops 48 and 50 are reset.

FIG. 6 shows another embodiment of the present invention. This embodiment is similar to that of FIG. 4, so that the same reference numbers have been employed to designate like parts and only the differences will be discussed. This embodiment can generate multi-phase pulses by adding second memory section 60 and second transition detector 62. It should be noted that oscillator 14, counter 16 and address decoder section 44 are used in common for memory sections 46 and 60. Flip-flop 64 corresponds to flip-flop 26, and receives a second strobe selection O at the D input terminal and the writing control signal J through AND gate 66 (as a buffer) at the set input terminal. Since oscillator 14 receives both the $\overline{Q}$ outputs from flip-flops 26 and 64, oscillator 14 stops the oscillation when both the $\overline{Q}$ outputs are "Low". Transition detector 62 consists of flip-flops 68-70 and AND gate 72, and the connections of each element are the same as transition detector 22. Exclusive OR gate 74 receives the output from flip-flop 70 and a second polarity control signal P, and generates a push-pull output Q and R in accordance with the contents of memory section 60. While programming, memory section 60 stores a second pulse pattern N.

While we have shown and described herein the preferred embodiments of our invention, it will be apparent to those skilled in the art that many changes and modifications may be made without departing from our invention in its broader aspects. For example, oscillator 14 may be a crystal oscillator for providing an accurate timing pulse.

What we claim as being novel is:

1. A programmable pulse generator, comprising:
    an oscillator for generating a pulse in response to a trigger signal;
    a counter for counting the pulse from said oscillator to generate an address signal;
    a memory circuit for generating a pulse having predetermined leading and trailing edges in accordance with the address signal from said counter; and
    a transition detector for detecting the trailing edge of the pulse from said memory circuit to stop the oscillation of said oscillator, said transition detector comprising a first D-type flip-flop to receive the output from said memory circuit at a D input terminal thereof and the pulse from said oscillator at a clock terminal thereof, a second D-type flip-flop to receive the Q output from said first D-type flip-flop at a D input terminal thereof and the pulse from said oscillator at a clock terminal thereof, and an AND gate to receive the $\overline{Q}$ output from said first $\overline{D}$-type flip-flop and the Q output from said second D-type flip-flop, the output from said AND gate stopping the oscillation of said oscillator.

2. A pulse generator according to claim 1, wherein said counter is cleared before oscillating.

3. A pulse generator according to claim 1, wherein said memory circuit is a random access memory.

4. A pulse generator according to claim 1 further including a writing circuit for storing pulse pattern in said memory circuit.

5. A pulse generator according to claim 4, wherein said writing circuit applies a pulse to a clock terminal of said counter and further applies said pulse pattern to said memory circuit in synchronism with said pulse.

6. A programmable pulse generator, comprising:
    an oscillator for generating a pulse in response to a trigger signal;
    a counter for counting the pulse from said oscillator to generate an address signal;
    a first memory circuit for generating a first pulse having predetermined leading and trailing edges in accordance with the address signal from said counter;
    a second memory circuit for generating a second pulse having predetermined leading and trailing edges in accordance with the address signal from said counter;
    a first transition detector for detecting the trailing edge of the first pulse from said first memory circuit; and
    a second transition detector for detecting the trailing edge of the second pulse from said second memory circuit;
    wherein said oscillator stops the oscillation when both said first and second transition detectors detect the trailing edges.

* * * * *